United States Patent
Siergiej et al.

[11] Patent Number: 5,945,701
[45] Date of Patent: Aug. 31, 1999

[54] STATIC INDUCTION TRANSISTOR

[75] Inventors: Richard R. Siergiej, Harrison City; Anant K. Agarwal, Monroeville; Rowland C. Clarke, Saltsburg; Charles D. Brandt, Mt. Lebanon, all of Pa.

[73] Assignee: Northrop Grumman Corporation, Los Angeles, Calif.

[21] Appl. No.: 08/995,080

[22] Filed: Dec. 19, 1997

[51] Int. Cl.$^6$ .......................... H01L 29/80; H01L 29/808; H01L 29/812

[52] U.S. Cl. .......................... 257/285; 257/263; 257/264; 257/266; 257/267; 257/77

[58] Field of Search ...................... 257/77, 136, 263–267, 257/285, 498

[56] References Cited

U.S. PATENT DOCUMENTS

| | | | |
|---|---|---|---|
| 4,326,209 | 4/1982 | Nishizawa et al. | 257/264 |
| 4,551,909 | 11/1985 | Cogan et al. | 257/285 X |
| 4,587,712 | 5/1986 | Baliga | 257/136 X |
| 5,418,376 | 5/1995 | Muraoka et al. | 257/136 |

FOREIGN PATENT DOCUMENTS 58-169974  10/1983  Japan ...................................... 257/136

OTHER PUBLICATIONS

R.R. Siergeij, et al., "High Power 4H–SiC Static Induction Transistors," IEDM, 1995, pp. 353–356.

*Primary Examiner*—John Guay

[57] ABSTRACT

A static induction transistor having source, drain and gate regions. Channel regions are defined between adjacent gates and a drift region is defined from the ends of the channel regions to the drain. The channel and drift regions have predetermined doping concentrations with the doping concentration of the channel regions being greater than the doping concentration of the drift region.

8 Claims, 8 Drawing Sheets

STATIC INDUCTION TRANSISTOR

CROSS REFERENCE TO RELATED APPLICATIONS

The present application is related in subject matter to the following applications, all of which are assigned to the assignee of the present application:

Ser. No. 08/462,405 filed Jun. 5, 1996, now U.S. Pat. No. 5,612,547;

Ser. No. 08/708,447 filed Sep. 5, 1996, now U.S. Pat. No. 5,705,830;

Ser. No. 08/877,847 filed Jun. 18, 1997.

BACKGROUND OF THE INVENTION

1. Field of the Invention

The invention in general relates to static induction transistors and more particularly to a high power, high frequency static induction transistor.

2. Description of Related Art

A typical static induction transistor is a vertical structure device wherein active carriers flow from a source region to a drain region on opposite sides of a substrate member. Current flowing from source to drain is controlled by an electrostatic potential barrier induced by gate regions positioned on either side of the source region. The static induction transistor has a D.C. current-voltage (I–V) characteristic similar to a vacuum tube triode and is relatively linear over a wide range of drain current values.

In addition, as compared to lateral device structures, the vertical static induction transistor exhibits higher breakdown voltage due to reduced field crowding and surface breakdown may be controlled by the use of guard rings or field plates, by way of example.

As will be described, a portion of the semiconductor material of the static induction transistor is deposited upon a substrate by epitaxial growth techniques such as vapor phase epitaxy during which process intentional impurity atoms of a dopant are added, as desired, to produce layers with predetermined dopant levels and conductivities.

If the dopant level is made relatively high, then the device tends to exhibit reduced and non-linear voltage gain at certain low bias conditions. Conversely, if the dopant level is made relatively low, the maximum current and power output of the device tends to be limited.

The present invention provides for an improved static induction transistor which exhibits relatively high as well as uniform voltage gain but without any significant decrease in maximum output power.

SUMMARY OF THE INVENTION

An improved static induction transistor is provided which includes a semiconductor body having a substrate with a plurality of semiconductor layers thereon and including at least one source for supplying majority carriers and at least one drain, displaced from said source, for collecting said majority carriers. At least two gates are provided and are positioned relative to said semiconductor body for controlling flow of said majority carriers from said source. The semiconductor body has a first region, a channel region, contiguous to said source and gates in which said gates control flow of said majority carriers from said source to said drain. The semiconductor body also has a second region, a drift region, which extends from said first region to said drain. The first and second regions have predetermined impurity atoms of a dopant added, with said first region having a higher average doping concentration than said second region.

DESCRIPTION OF THE PREFERRED EMBODIMENT

In the drawings, which are not necessarily to scale, like or corresponding parts are denoted by like or corresponding reference numerals.

Figure 1:
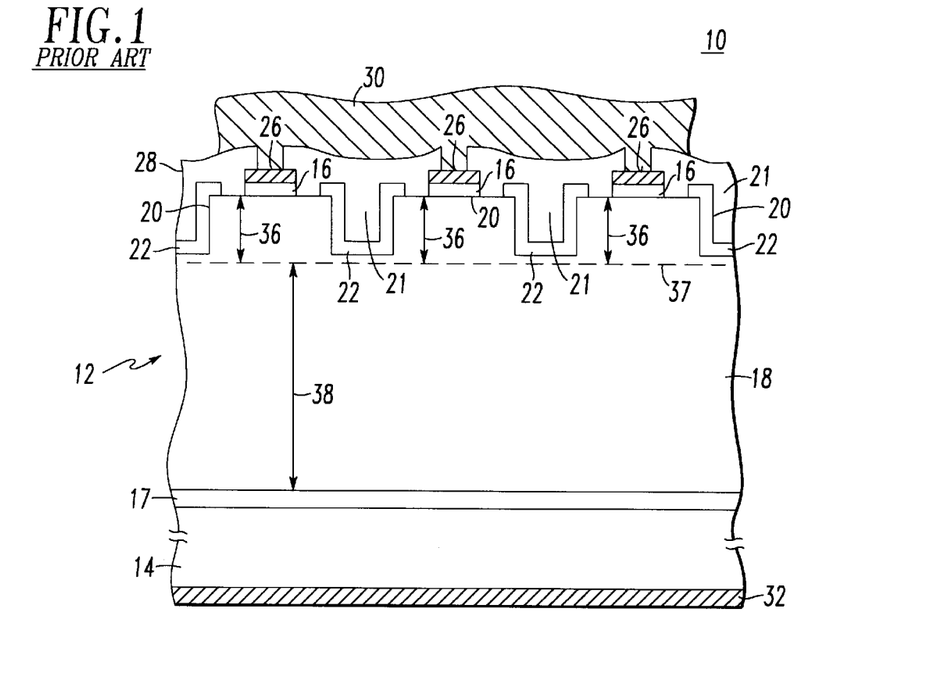
FIG. 1 illustrates one type of known static induction transistor.

FIG. 1 represents a portion of a conventional static induction transistor in the form of a Schottky barrier recessed gate type static induction transistor 10, such as described in the aforementioned application Ser. No. 08/708, 447. The transistor includes a semiconductor body 12 of a selected conductivity type comprised of a plurality of layers including a substrate member 14, which may act as the drain region for collecting majority carriers provided by source regions 16.

In a preferred embodiment, the semiconductor body is of polytype 4H silicon carbide which offers improved performance over conventional materials such as silicon. This includes higher breakdown voltage, lower thermal impedance due to better thermal conductivity, higher frequency performance, higher maximum current higher operating temperature and improved reliability, particularly in harsh environments. Although silicon carbide is the preferred semiconductor, it is to be understood that the present invention is applicable to static induction transistors made of other materials such as silicon, gallium arsenide, gallium nitride and indium phosphide and other polytypes of silicon carbide, by way of example.

The silicon carbide substrate member 14, cut from a grown silicon carbide boule, may have slight imperfections in its surface which could lead to breakdown during transistor operation. Accordingly, a silicon carbide buffer layer 17 may be deposited to provide a transition from a relatively low electric field in the substrate 14 to a relatively high electric field in the next deposited layer 18.

This layer 18 includes a plurality of mesas 20 defining recesses 21 therebetween for receiving Schottky barrier gates 22 which extend along the bottom of the mesas, up the sidewalls thereof and onto the top portion of the mesa on either side of the source regions 16.

The source regions include respective ohmic contacts 26 and the arrangement is covered with a protective oxide layer 28 through which apertures are provided for electrically connecting all of the source contacts 26 to a metallization layer 30. Electrical contact is made to the drain region 14 by means of ohmic contact 32.

Layer 18 includes a first region 36 between the gates 22 and which extends from the source 16 to the bottom of the gate 22, or slightly below it, as indicated by the dotted line 37. This first region is where the gate controls the flow of majority carriers from the source and is termed herein the channel layer or channel region. A second region 38 extends from the first region to the drain 14 (to the top of buffer layer 17, if provided) and is the region where the majority carriers drift toward the drain and is termed herein the drift layer or drift region.

Figure 2:
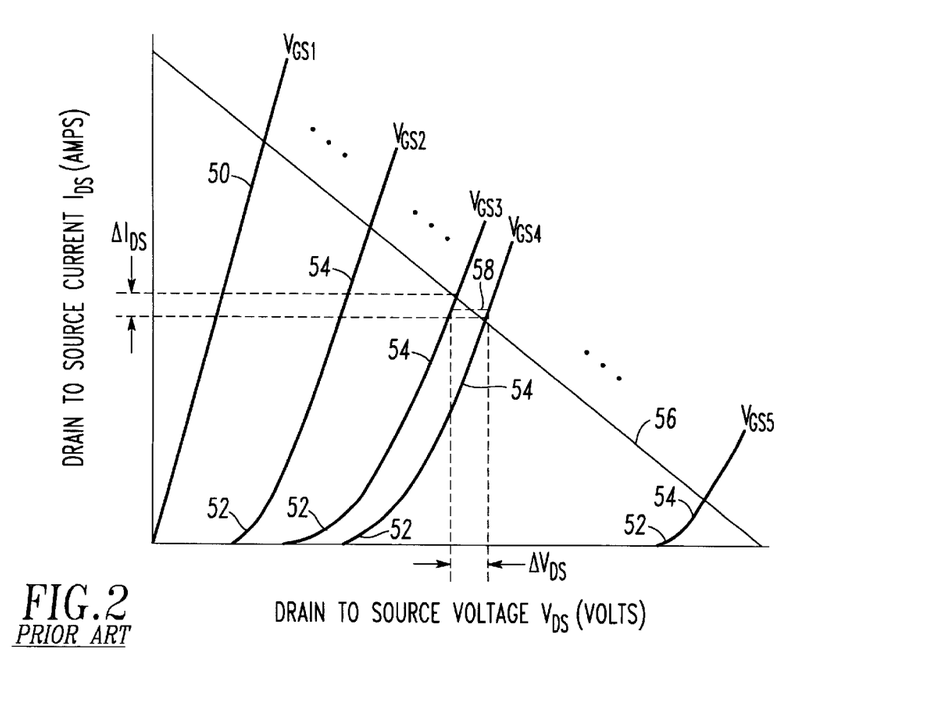
FIG. 2 shows typical characteristic curves associated with a static induction transistor.

FIG. 2 illustrates some typical characteristic curves associated with the static induction transistor of FIG. 1. Drain-to-source current $I_{DS}$ is plotted on the vertical axis and drain-to-source voltage $V_{DS}$ is plotted on the horizontal axis. Very basically, at relatively low gate bias $V_{GS1}$ the channel region depletes to a certain width from each gate leaving a channel through which ohmic current conduction takes place. This is represented by curve 50. As the drain bias increases, the channel becomes depleted and the form of conduction changes, after a thermionic emission mode at points 52, to a space charge limited mode as represented by curves 54. The above is a simplification and in reality some of the modes may be present simultaneously.

During operation in a circuit, a load line 56 is established, as a function of the load, and a quiescent operating point is selected. As an applied input signal to the gate is varied, the operating point will move up and down the load line providing a corresponding varying drain-to-source current. It is critical therefore that the transconductance and voltage gain be constant as the input signal varies so as to reduce distortion. The voltage gain $\mu$ of the device is the change in drain-to-source voltage for a given change in gate-to-source bias, at a given point on the load line. Thus from FIG. 2, at point 58, $\mu=\Delta V_{DS}/(V_{GS4}-V_{GS3})$. Transconductance $g_m$ is the change in drain-to-source current for a given change in gate-to-source bias at a given point on the load line. Thus from FIG. 2, at point 58 $g_m=\Delta I_{DS}/(V_{GS4}-V_{GS3})$.

Figure 3:
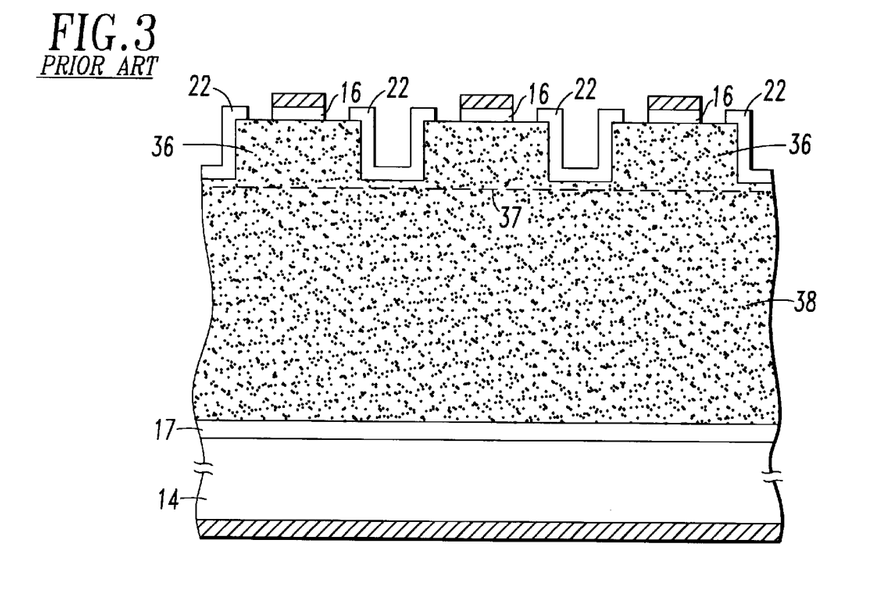
FIG. 3 illustrates the doping concentration for the static induction transistor of FIG. 1.

FIG. 3 is a simplified presentation of the static induction transistor of FIG. 1. During fabrication of the device, a plurality of layers of silicon carbide are deposited on the substrate by epitaxial growth techniques such as vapor phase epitaxy. During this deposition process intentional impurity atoms of a dopant such as nitrogen are added, as desired, to produce layers with predetermined dopant levels and conductivities. The semiconductor layer between the source 16 and buffer layer 17, constituting the channel and drift layers 36 and 38, has a relatively high uniform dopant level of around $1\times10^{16}$ cm$^{-3}$ (atoms per cubic centimeter), as indicated by the uniform stippling.

Figure 4:
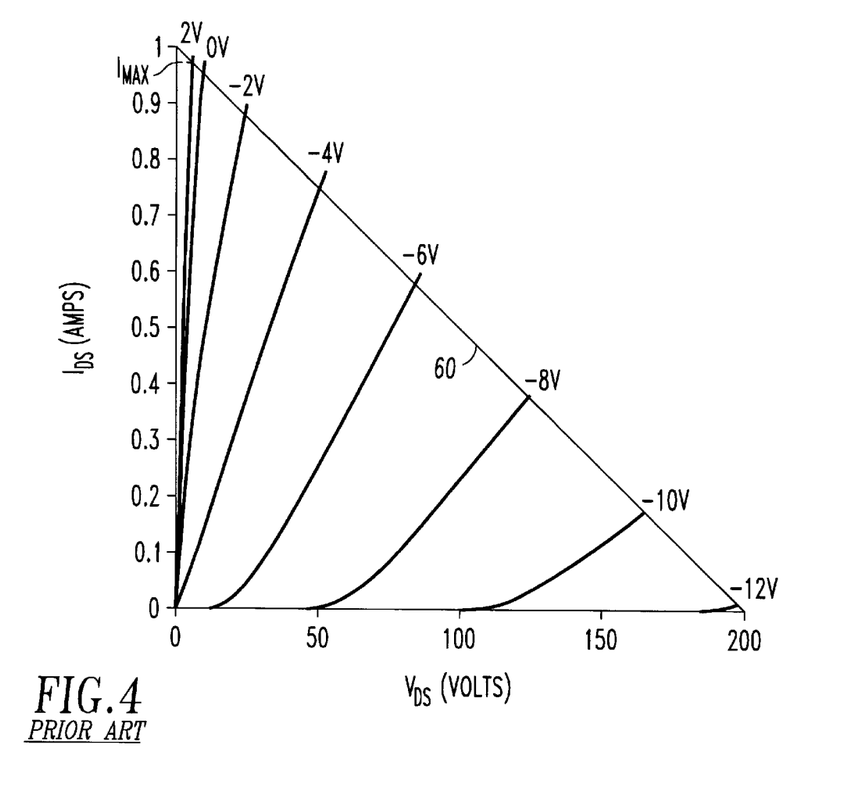
FIG. 4 shows characteristic curves for the static induction transistor of FIG. 3.

The consequences of this uniform doping level may be seen in the I–V characteristic curves of FIG. 4 which includes a 200 ohm load line 60. The curves of FIG. 4 (as well as FIGS. 5, 7, 8, 13 and 14) are a computer generated plot for a silicon carbide device having a mesa height of 1 $\mu$m, a mesa width of 1.5 $\mu$m, a channel layer thickness of 1.5 $\mu$m, a drift layer thickness of 4 $\mu$m and a uniform doping of $1\times10^{16}$ cm$^{-3}$. Gate biases of 2, 0, -2, -4, -6, -8 -10 and -12 are plotted.

The operating range of the device is expected to traverse the load line as the gate bias changes. When the gate bias is 2 V, the load line intersects the I–V characteristics at the maximum $I_{DS}$ value or $I_{max}$. When the gate bias is -12 V, there is very little drain-to-source current for $V_{DS}$=200 V, which would be the blocking voltage, or $V_{max}$, for this particular gate bias. The blocking voltage is the highest drain-to-source voltage at which the device blocks drain-to-source current.

A figure of merit for a microwave power device is the expected power density obtained to first order through the expression, $P=(I_{max}\times V_{max})/8$. Thus is it desirable to have as much current as possible for $V_{GS}$=2 V and the largest reliable blocking voltage. It is to be noted that $I_{max}$ and blocking voltage depend on the particular load line. Additionally, blocking voltage cannot be made arbitrarily large since large magnitudes of gate-to-source voltage soon approach the intrinsic breakdown field in the semiconductor in the vicinity of the gate and source contacts.

Figure 5:
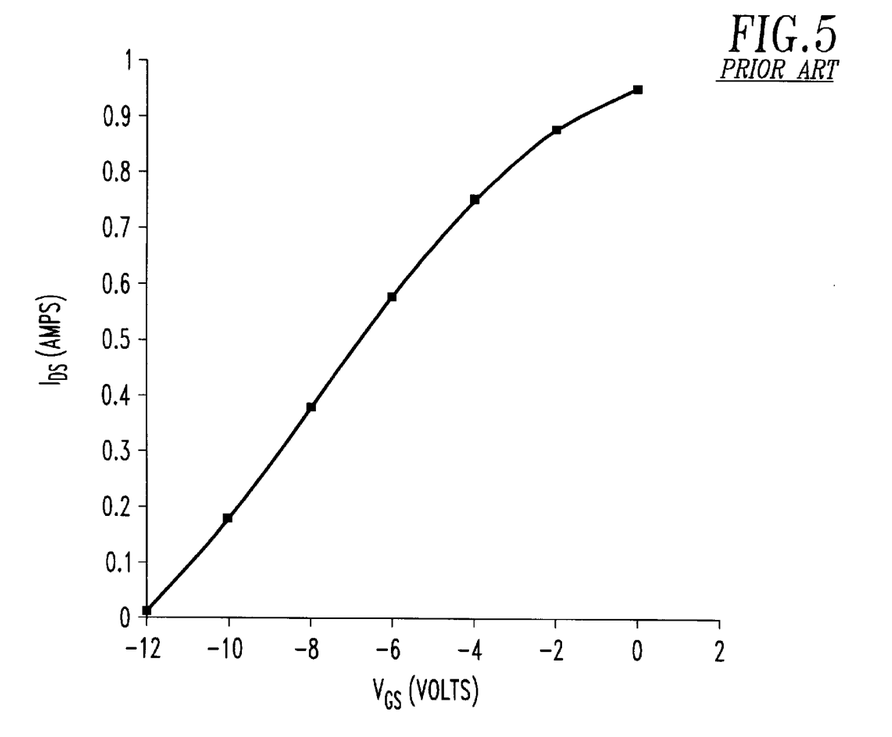
FIG. 5 is a curve showing the drain-to-source current as a function of gate-to-source voltage for a given load condition for the static induction transistor of FIG. 3.

FIG. 5 plots the drain-to-source current as a function of $V_{GS}$ along the load line. A straight line is desirable, showing linearity in the device when it is used as an amplifier. The slope of the line, that is, $\Delta I_{DS}/\Delta V_{GS}$ is the transconductance. For $V_{GS}$ biases less than -4 V, the transconductance is relatively constant.

The computer generated I–V plot in FIG. 4 potentially suffers from two problems. While the I–V characteristic appears to have very large $I_{max}$, it's unlikely blocking voltages of 200 V can be achieved due to reliability concerns with large values of $V_{GS}$. This arises due to the close proximity of the gate 22 and the source region 16 (FIG. 1). Since the distance of the semiconductor region between these two elements is on the order of 0.5 $\mu$m, or less, electric fields approaching the critical breakdown field of the semiconductor can be generated in this region.

Figure 6:
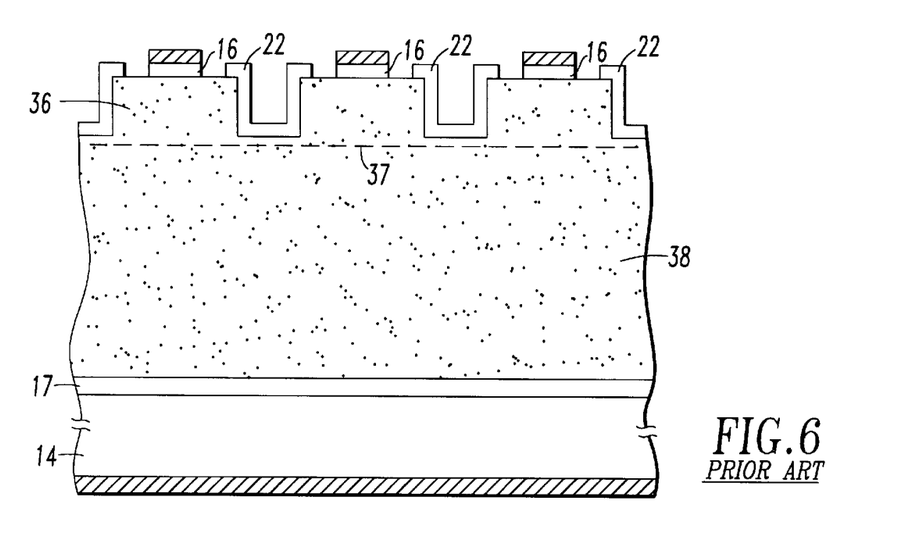
FIG. 6 illustrates a lighter doping concentration for the static induction transistor of FIG. 1.
Figure 7:
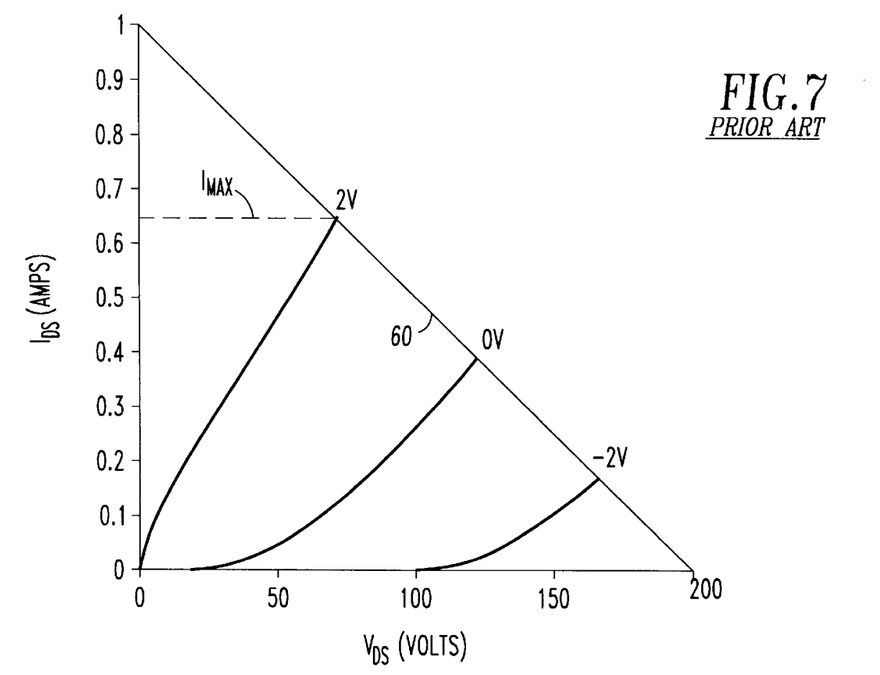
FIG. 7 shows characteristic curves for the static induction transistor of FIG. 6.
Figure 8:
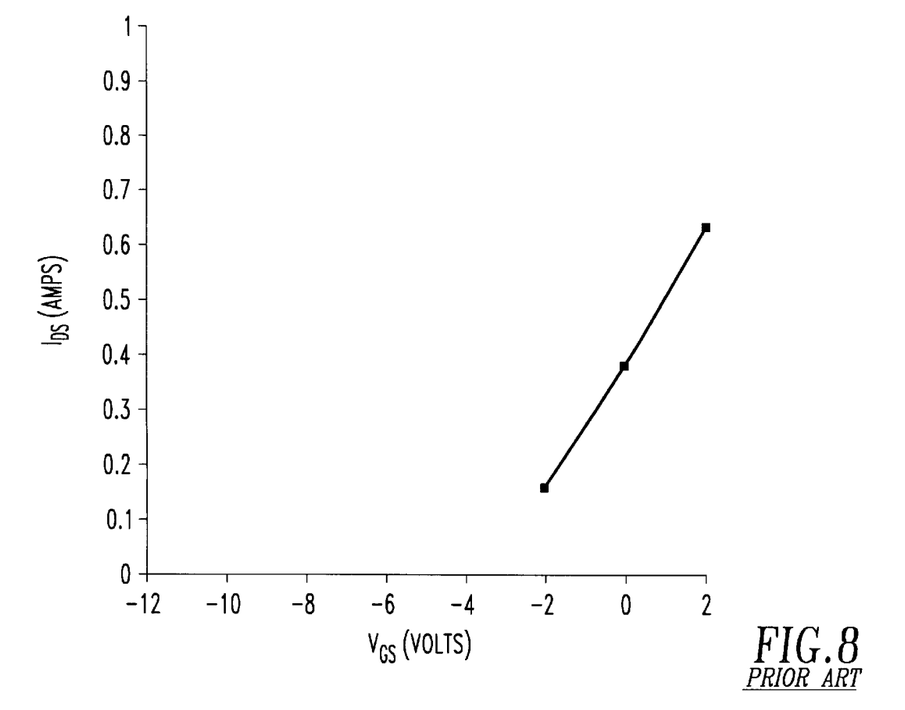
FIG. 8 is a curve showing the drain-to-source current as a function of gate-to-source voltage for a given load condition for the static induction transistor of FIG. 6.

To circumvent these issues, a potential solution is to lower the uniform doping to a value of, for example, $1\times10^{15}$ cm$^{-3}$, as depicted by the structure of FIG. 6 wherein the reduced stippling density corresponds to the reduced doping level. Plots for $I_{DS}$ vs. $V_{DS}$, and $I_{DS}$ vs. $V_{GS}$, for this lower doping value are seen in FIGS. 7 and 8 respectively. The $I_{DS}$ vs. $V_{GS}$ curve of FIG. 8 is more linear than that of FIG. 5 for the higher dopant concentration case, and a lower $V_{GS}$ (approximately -3 V vs. -12 V) is required for a blocking voltage, or $V_{max}$, of 200 V. However, the value of $I_{max}$ has severely dropped. This would lead to less power output since power output, P, is $(I_{max}\times V_{max})/8$.

Thus it would appear that some desirable properties of the static induction transistor are mutually exclusive. In other words, large values of $I_{max}$ generally mean less $V_{max}$ or reduced voltage gain. More constant voltage gain reciprocates with lower $I_{max}$. Reliability concerns over maximum values of $V_{GS}$ forces the design of a high voltage gain device with small $I_{max}$ and therefore smaller power capabilities.

Figure 9:
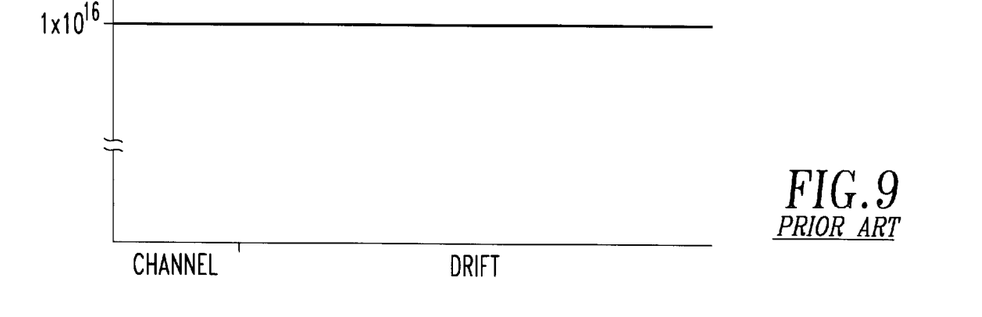
FIG. 9 shows a doping profile for the static induction transistor of FIG. 3.
Figure 10:
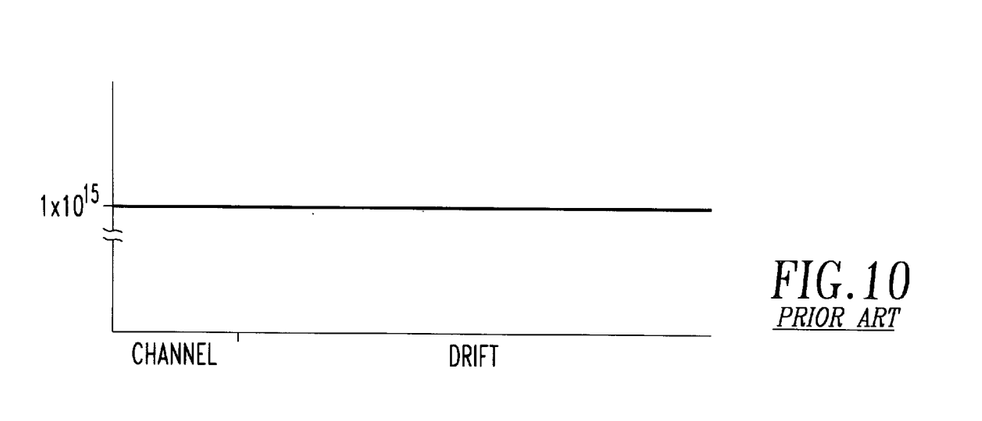
FIG. 10 shows a doping profile for the static induction transistor of FIG. 6.
Figure 11:
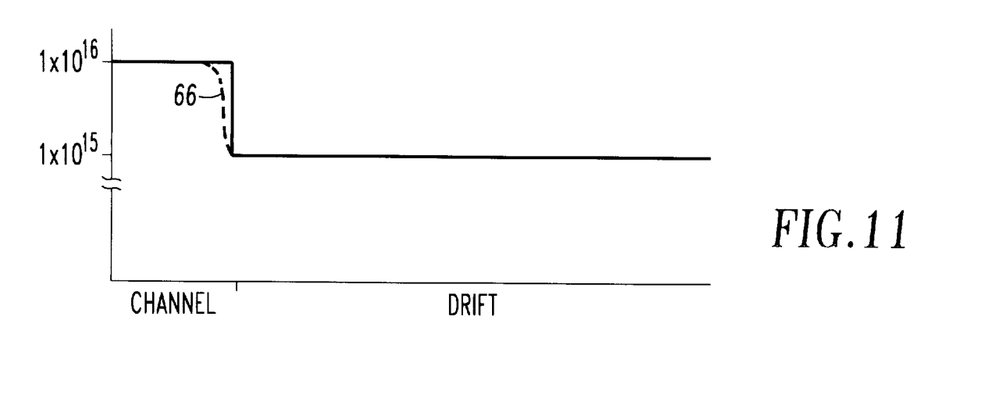
FIG. 11 shows a doping profile in accordance with the present invention.

With the present invention a static induction transistor is provided which has relatively high maximum drain-to-source current and high blocking voltage for maximum power, and has high, as well as relatively uniform, transconductance and voltage gain throughout the input signal range. FIG. 9 illustrates the doping concentration profile for the device of FIG. 3 and shows a uniform doping of $1 \times 10^{16}$ cm$^{-3}$ in both the channel and drift regions. FIG. 10 illustrates a doping concentration profile for the device of FIG. 6 and shows a uniform doping of $1 \times 10^{15}$ cm$^{-3}$. FIG. 11 illustrates a doping concentration profile in accordance with the present invention.

More particularly, as seen in FIG. 11, the doping in the channel region is maintained at a relatively high level of $1 \times 10^{16}$ cm$^{-3}$, however the doping concentration is reduced in the drift region. By way of example, the doping level in the channel region may be in the order of 1 to $2 \times 10^{16}$ cm$^{-3}$, and the doping level in the drift region may be in the order of 1 to $5 \times 10^{15}$ cm$^{-3}$. In actuality, the change in doping levels may not be as abrupt as shown by the solid line, but rather follows a transition from a high value to a lower value in accordance with the dotted portion 66 of the curve. Whatever the transition, the average doping concentration in the channel region is higher than the average doping concentration in the drift region, the difference being from about 2 times to an order of magnitude higher in the channel region. Not shown in FIGS. 9, 10 and 11 are the doping concentrations for the source and buffer layers which may be $1 \times 10^{19}$ and $1 \times 10^{18}$ cm$^{-3}$ respectively.

Figure 12:
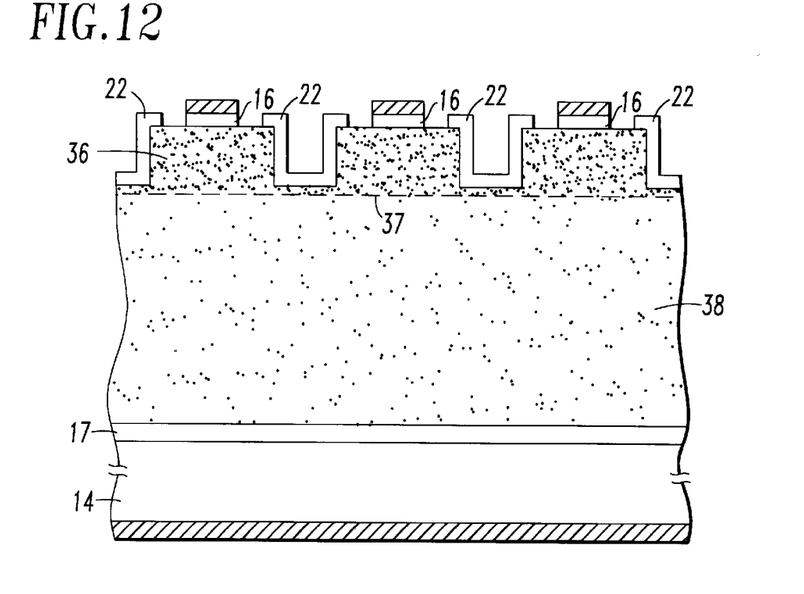
FIG. 12 illustrates the doping concentration for a static induction transistor of the present invention.

A static induction transistor as described in FIG. 3 is illustrated in FIG. 12, however, with the dual doping in accordance with the present invention being depicted by the lighter stippling density in the drift region 38. That is, the channel region 36 and the drift region 38 have respective doping concentrations as illustrated in FIG. 11.

Figure 13:
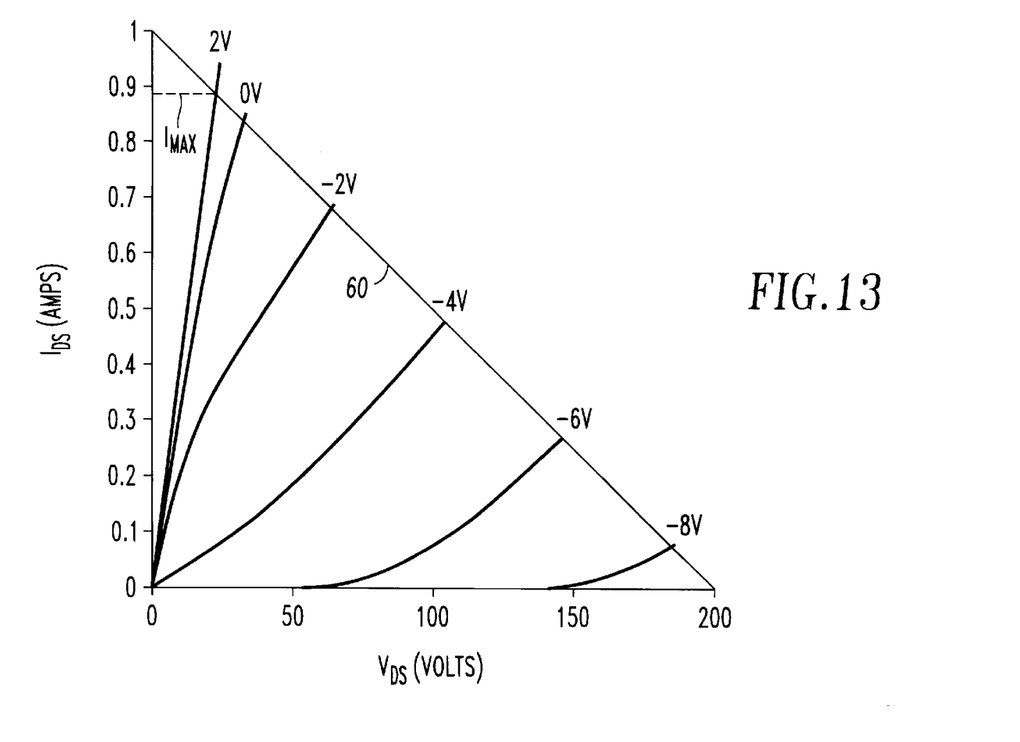
FIG. 13 shows characteristic curves for the static induction transistor of FIG. 12.
Figure 14:
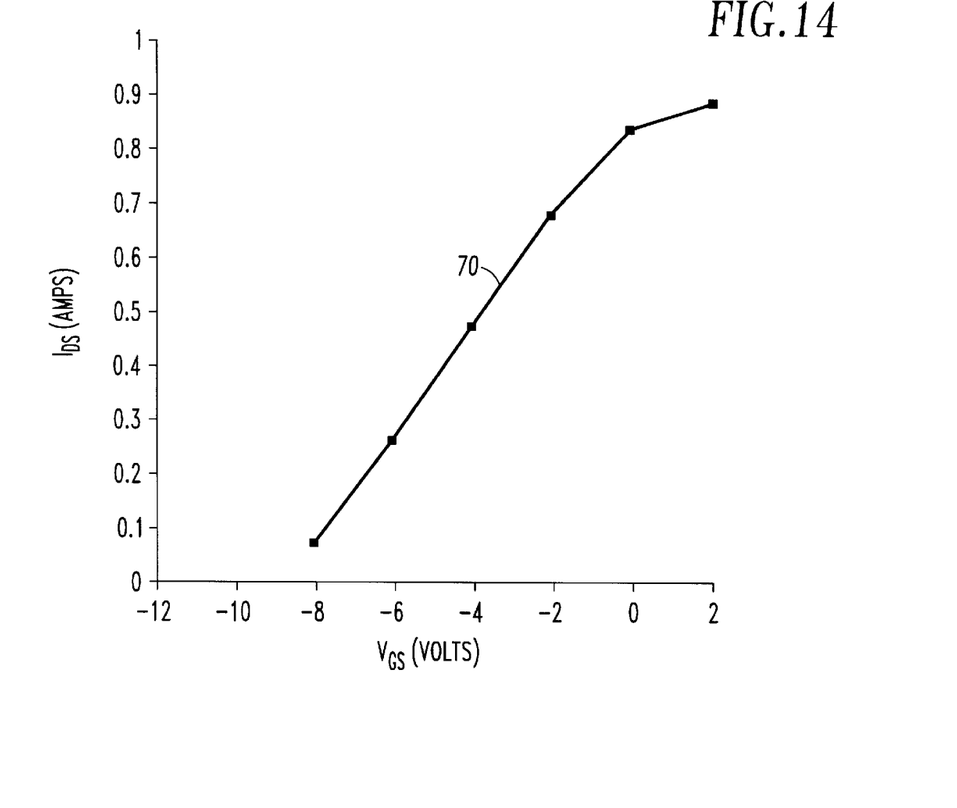
FIG. 14 is a curve showing the drain-to-source current as a function of gate-to-source voltage for a given load condition for the static induction transistor of FIG. 12.

The dual doping concept of the present invention provides a compromise to yield desirable $I_{max}$, low values of $V_{GS}$ for $V_{max}$, and desirable transconductance and voltage gain. FIGS. 13, and 14 show the $I_{DS}$ vs. $V_{DS}$ and $I_{DS}$ vs. $V_{GS}$, curves. An $I_{max}$ value similar to the high uniform doping case is obtained, with only about –9 V gate bias required to block current at $V_{DS}$=200 V. The $I_{DS}$ vs. $V_{GS}$ curve of FIG. 14 is still highly linear, and exhibits a relatively constant slope, or transconductance for gate bias values of less than 0 V. Voltage gain is near constant over half the operating range defined by the intersection of the load line with the I–V curves of FIG. 13. The device of FIG. 12 has almost the power capability of the uniformly high doped device (FIG. 3), with less $V_{GS}$ required for blocking voltage control.

Full and constant voltage gain is achieved when the drift region is fully depleted. It is desirable to reach the full voltage gain at the smallest value of gate bias in order to achieve linearity and to reach the full drain-to-source blocking voltage with minimum gate-to-source bias. This is accomplished with the dual doping arrangement since the lower conductivity drift region 38 of FIG. 12 depletes more quickly than the same, but higher conductivity drift region 38 of FIG. 3.

The reduced doping concentration in the drift region has the effect of reducing the steepness of the ohmic current component, however, as seen in FIGS. 4 and 13, the resulting reduction in maximum current is slight, from a previous $I_{max}$ of about 0.97 amps to a new $I_{max}$ of about 0.89 amps, as compared to an $I_{max}$ of about 0.63 amps (FIG. 7) with the lower doped device. With a relatively high blocking voltage, the power output, which is a function of maximum drain-to-source current and blocking voltage, remains high.

For the device in accordance with the present invention, once past a gate bias of $V_{GS} \cong -2$ V, the voltage gain is higher and more nearly constant. That is, the distance between gate bias curves is wider and more uniform than those of FIG. 4. Additionally, transconductance is nearly constant as seen in FIG. 14 wherein a relatively linear (once past 0 V) drain-to-source current curve 70 as a function of gate bias, is illustrated.

Figure 15:
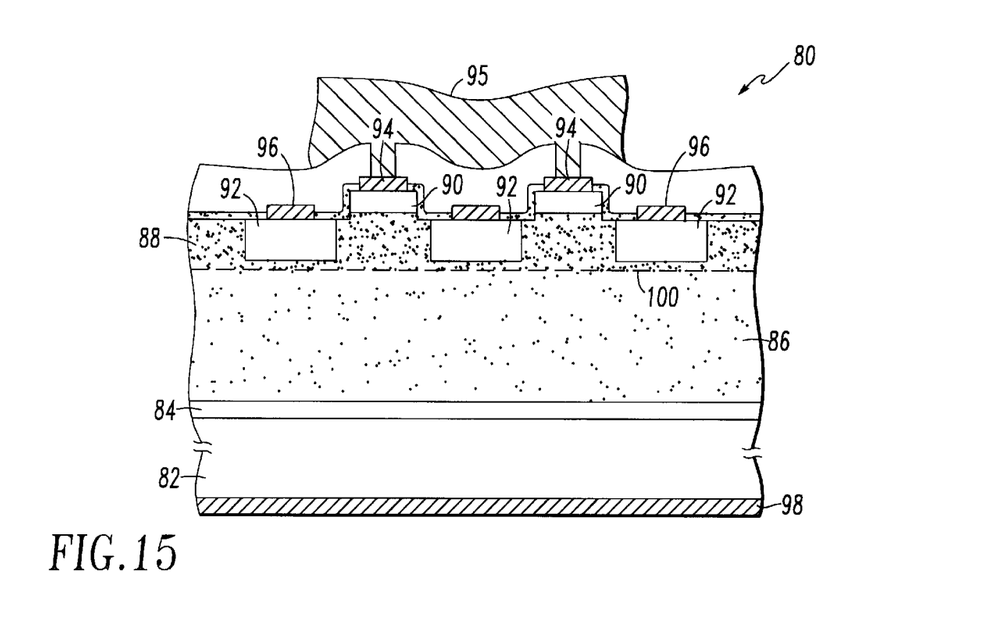
FIGS. 15 and 16 illustrate other types of static induction transistors which incorporate the present invention.

As previously mentioned, the improved doping arrangement is also applicable to various other static induction transistor structures. For example, FIG. 15 illustrates a static induction transistor 80 which includes a silicon carbide substrate 82 on top of which is deposited a buffer layer 84, to constitute the transistor drain. Additional silicon carbide layers include an n type drift region 86, n type channel regions 88 and n type source regions 90. Gates 92, alternating laterally with source regions 90, are of a p type semiconductor material and are formed in the semiconductor body by a series of ion implantation steps, as described in the aforementioned application Ser. No. 08/877,847. For semiconductor materials other than silicon carbide, the gate regions may be formed by a diffusion and/or implantation process. Suitable electrical connections are made to the transistor 80 by means of source contacts and metallization 94 and 95, gate contacts 96 and drain contact 98.

In an arrangement similar to the embodiment of FIG. 12, and as indicated by the stippling, transistor 80 includes channel regions 88 of a higher doping concentration than that of drift region 86, the approximate demarcation being indicated by dotted line 100.

Figure 16:
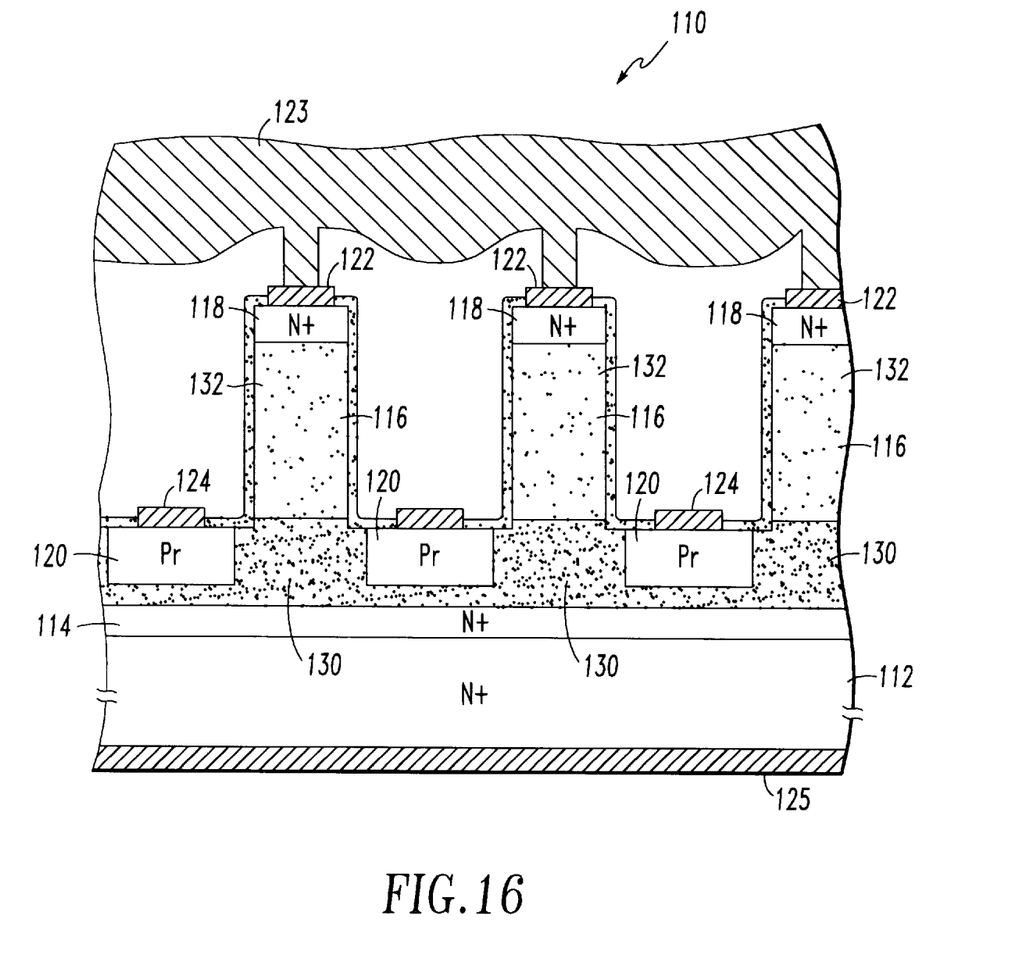

FIG. 16 illustrates a static induction transistor 110 wherein the position of the source and drain regions have been reversed. More particularly, the structure includes a source formed by substrate 112 and buffer layer 114. A plurality of mesas 116 defined in the n type semiconductor body include at the ends thereof respective drain regions 118. Gate regions 120 formed by ion implantation or other process are of p type conductivity and are defined in the semiconductor body between mesas 116. Suitable electrical connection is made to the structure by means of drain contacts and metallization 122 and 123, gate contacts 124 and source contact 125. Channel regions 130, between gates 120 are of a higher doping concentration than drift regions 132, providing a static induction transistor with superior performance, as previously described.

Although the present invention has been described with a certain degree of particularity, it is to be understood that various substitutions and modifications may be made without departing from the spirit and scope of the invention as defined in the appended claims.

What is claimed is:

1. A static induction transistor structure, comprising:
   (A) a semiconductor body of a selected conductivity type having at least one source for supplying majority carriers and at least one drain for collecting said carriers;
   (B) said source and drain being vertically spaced on opposite sides of said semiconductor body;
   (C) at least two gates positioned relative to said semiconductor body for controlling flow of said carriers from said source;
   (D) said semiconductor body having a first region contiguous to said source and gates in which said gates control flow of said carriers from said source to said drain, and a second region extending from said first region to said drain;

(E) said first and second regions having predetermined impurity atoms of a dopant added thereto, said first region having an average doping concentration of approximately 1 to $2 \times 10^{16}$ cm$^{-3}$ and said second region having a average doping concentration of approximately 1 to $5 \times 10^{15}$ cm$^{-3}$.

2. A static induction transistor structure according to claim 1 wherein:

(A) the doping concentration of said first region is at least two times that of said second region.

3. A static induction transistor structure according to claim 2 wherein:

(A) the doping concentration of said first region is an order of magnitude greater that of said second region.

4. A static induction transistor structure according to claim 1 wherein:

(A) said semiconductor body is of silicon carbide.

5. A static induction transistor structure according to claim 1 wherein:

(A) said semiconductor body is selected from the group including silicon, gallium arsenide, gallium nitride and indium phosphide.

6. A static induction transistor structure according to claim 1 wherein:

(A) said transistor structure is a recessed Schottky gate type static induction transistor.

7. A static induction transistor structure according to claim 1 wherein:

(A) said first and second regions are of one conductivity type; and (B) said gates are defined in said semiconductor body and are of a conductivity type opposite that of said first and second regions.

8. In a static induction transistor having a channel region and a drift region, the improvement comprising:

(A) said channel region having a first predetermined doping concentration;

(B) said drift region having a second predetermined doping concentration;

(C) said first predetermined doping concentration being approximately 1 to $2 \times 10^{16}$ cm$^{-3}$ and said second predetermined doping concentration being approximately 1 to $5 \times 10^{15}$ cm$^{-3}$.

\* \* \* \* \*